United States Patent
Asai et al.

(10) Patent No.: US 6,426,519 B1
(45) Date of Patent: Jul. 30, 2002

(54) EPITAXIAL GROWTH SUBSTRATE AND A METHOD FOR PRODUCING THE SAME

(75) Inventors: Keiichiro Asai, Nagoya; Tomohiko Shibata, Kasugai; Yukinori Nakamura, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 9 days.

(21) Appl. No.: 09/713,547

(22) Filed: Nov. 15, 2000

(30) Foreign Application Priority Data

Nov. 17, 1999 (JP) ............................................. 11-326650
Nov. 13, 2000 (JP) ........................................ 2000-344808

(51) Int. Cl.$^7$ ............................................. H01L 29/78
(52) U.S. Cl. ......................... 257/103; 257/522; 438/511
(58) Field of Search ................................. 257/103, 522; 438/511, 503

(56) References Cited

U.S. PATENT DOCUMENTS 5,218,216 A * 6/1993 Manabe et al.
6,252,253 B1 * 6/2001 Bao et al.
6,326,638 B1 * 12/2001 Kamiyama et al.
6,329,667 B1 * 12/2001 Ota et al.

FOREIGN PATENT DOCUMENTS

JP        2000-106455        4/2000

OTHER PUBLICATIONS

J. Appl. Phys, vol. 68, No. 7, p. 774–779, Jul. 1999.

* cited by examiner

Primary Examiner—Stephen D. Meier
(74) Attorney, Agent, or Firm—Burr & Brown

(57) ABSTRACT

Strip-shaped ditches are formed on a sapphire substrate as a base material. Then, the sapphire substrate is set into a CVD chamber, and an $Al_xGa_yIn_zN$ ($x+y+z=1, x>0, y, z \geq 0$) film is epitaxially grown on the sapphire substrate so as to embed the ditches by a selective lateral epitaxial growth method. As a result, the $Al_xGa_yIn_zN$ film has low dislocation density areas on at least one of the concave portions and the convex portions of the strip-shaped ditches.

9 Claims, 4 Drawing Sheets

EPITAXIAL GROWTH SUBSTRATE AND A METHOD FOR PRODUCING THE SAME

BACKGROUND OF THE INVENTION (1) Field of the invention:

This invention relates to an epitaxial growth substrate comprising a base material composed of a sapphire substrate, a SiC substrate, a GaN substrate or the like and an $Al_xGa_yIn_zN$ film ($x+y+z=1, x>0, y,z \geqq 0$) on the base material, and a method for producing the same.

(2) Related Art Statement:

An epitaxial growth substrate is employed for an electronic device such as a light emitting diode (LED), a laser diode (LD) or a field effect transistor (FET). In producing such an electronic device, semiconductor films such as $Al_aGa_bIn_cN$ film ($a+b+c=1, a,b,c \geqq 0$) are formed on the epitaxial growth substrate by epitaxial growth. Attention is paid to an $Al_aGa_bIn_cN$ film ($a+b+c=1, a,b,c \geqq 0$) because it has a large bandgap to generate and emit a short wavelength light in a light emitting element.

FIG. 1 is a cross sectional view showing a conventional light emitting diode to generate a blue light, which is composed of the above $Al_aGa_bIn_cN$ films.

For example, a GaN film 2 as a buffer layer is formed on a C-faced sapphire ($Al_2O_3$) substrate 1 at a low temperature by CVD, and an n-type $Al_aGa_bIn_cN$ film 3 is formed on the GaN film 2 by epitaxial growth through CVD. Then, a p-type $Al_aGa_bIn_cN$ film 4 is epitaxially grown on the n-type $Al_aGa_bIn_cN$ film 3 by epitaxial growth through CVD, and a low resistive p-type $Al_aGa_bIn_cN$ film 5 is epitaxially grown on the p-type $Al_aGa_bIn_cN$ film 4.

Electrodes 6 and 7 are formed on the n-type $Al_aGa_bIn_cN$ film 3 and the p-type $Al_aGa_bIn_cN$ film 5, respectively.

If the n-type $Al_aGa_bIn_cN$ film 3 is directly formed on the sapphire substrate 1 by CVD, it has a large amount of defect, its depleted crystallinity and its rough surface. Therefore, in this case, the light emitting diode having the directly formed n-type $Al_aGa_bIn_cN$ film can have a relatively small light emission efficiency.

Therefore, as shown in FIG. 1, the GaN film 2, which is formed at a low temperature by CVD, intervenes as the buffer layer between the sapphire substrate 1 and the n-type $Al_aGa_bIn_cN$ film 3. Since the GaN film 2 is epitaxially grown at a low temperature by CVD, the lattice constant difference of approximately 10% between the sapphire substrate 1 and the n-type $Al_aGa_bIn_cN$ film 3 is compensated, and the $Al_aGa_bIn_cN$ film can have its flat surface, which is very important in a heterojunction of the light emitting diode.

Moreover, it is proposed that an AlN film, which is epitaxially grown at a low temperature by CVD, is employed as the buffer layer instead of the GaN film 2.

However, if the $Al_aGa_bIn_cN$ film incorporating Al as an indispensable component is epitaxially grown on the GaN film or the AlN film formed at a low temperature by CVD, it has a large amount of dislocation, for example a dislocation density of $10^{10}/cm^2$.

Since the large amount of dislocation forms light absorption centers, a semiconductor device having the $Al_aGa_bIn_cN$ film with the large amount of dislocation is degraded. It is a large problem in an optical device such as a laser diode requiring a large light emitting efficiency. Moreover, the large amount of dislocation deteriorates the condition of the pn junction of the optical device or the like. Consequently, it is very important to reduce the dislocations.

In view of the reduction of the dislocations, a selective lateral epitaxial growth method is disclosed in "J. Appl. Phys, Vol. 68, No. 7, p.774–779". In the document, the selective lateral epitaxial growth method is employed in epitaxially growing a GaN film on a sapphire substrate. Therefore, the inventors of the present invention make an attempt to epitaxially grow the $Al_aGa_bIn_cN$ film by taking advantage of the above selective lateral epitaxial growth method.

In this case, as shown in FIG. 2a, a GaN film 12 is epitaxially grown in a thickness of 1–2 μm on one main surface of a sapphire substrate 11 by CVD, and thereafter, a strip-shaped mask 13 is formed of a SiN material on the GaN film 12. Then, a $Al_xGa_yIn_zN$ films ($x+y+z=1, x,y,z \geqq 0$) 14 are epitaxially grown on the GaN film 12.

As shown in FIG. 2b, the $Al_xGa_yIn_zN$ films 14 are epitaxially grown on the GaN film 12 alongside the mask 13, and then, are laterally grown on the mask 13 as they reach the upper surfaces of the mask 13. Lastly, as shown in FIG. 2c, the laterally grown $Al_xGa_yIn_zN$ films are coalesced on the mask 13.

In this case, the dislocations at the interfaces between the GaN film 12 and the $Al_xGa_yIn_zN$ films 14 are transmitted longitudinally, not laterally on the mask 13. Therefore, the $Al_xGa_yIn_zN$ films 14 have respective small amounts of dislocation, for example dislocation density of about $10^7/cm^2$, within areas W on the mask 13.

Therefore, if a light emitting element as shown in FIG. 1 is formed on the low dislocation density area W, it can exhibit good performances.

In the above conventional method, however, the sapphire substrate 11 is set into a CVD chamber, and then, the GaN film 12 is formed on the sapphire substrate 11. Thereafter, the sapphire substrate 11 is taken out of the CVD chamber, and the strip-shaped mask 13 is formed on the GaN film 12 by photolithography. Then, the sapphire substrate 11 is set into the CVD chamber again, and the $Al_xGa_yIn_zN$ films 14 are formed.

That is, since the conventional method requires the above complicated process in forming the $Al_xGa_yIn_zN$ films 14, it can not provide an epitaxial growth substrate efficiently.

Moreover, in forming step of the mask 13 after forming the GaN film 12 as a buffer layer, impurities are incorporated into the GaN film, resulting in the degradation of the properties of the GaN film.

The above phenomenon can be observed in the case of forming the GaN film on a SiC substrate or a GaN substrate instead of the sapphire substrate. Consequently, the above conventional method can not provide an epitaxial growth substrate having the above $Al_xGa_yIn_zN$ film, particularly the $Al_xGa_yIn_zN$ film ($x+y+z=1, x>0, y, z \geqq 0$) incorporating Al as an indispensable component with low dislocation density and good properties, efficiently.

SUMMARY OF THE INVENTION

It is an object of the present invention to provide an epitaxial growth substrate comprising a base material composed of a sapphire substrate, a SiC substrate, a GaN substrate or the like and an $Al_xGa_yIn_zN$ ($x+y+z=1, x>0, y, z \geqq 0$) film with low dislocation density and good properties thereon, on which $Al_aGa_bIn_cN$ ($a+b+c=1, a>0, b, c \geqq 0$) films having good properties can be formed by epitaxial growth.

It is another object of the present invention to provide a method for producing the above epitaxial growth substrate.

This invention relates to an epitaxial growth substrate comprising a base material having a strip-shaped concave-convex structure thereon and an epitaxially grown $Al_xGa_yIn_zN$ (x+y+z=1,x>0,y,z≧0) film formed so as to embed the concave-convex structure by a selective lateral epitaxial growth method and having low dislocation density areas on at least one of the concave portions and the convex portions of the concave-convex structure.

In a preferred embodiment of the present invention, the above concave-convex structure may be composed of plural kinds of strip-shaped ditches formed on the surface of the base material.

In the epitaxial growth substrate of the present invention, the cross sectional shape, size, ditch direction and aspect ratio of the above concave-convex structure can be determined appropriately in accordance with the composition and forming conditions of the $Al_xGa_yIn_zN$ film and a kind of device to be produced.

Moreover, this invention relates to A method for producing an epitaxial growth substrate comprising the steps of:

preparing a base material, forming a strip-shaped concave-convex structure on a surface of the base material, and epitaxially growing an $Al_xGa_yIn_zN$ (x+y+z=1,x>0,y,z≧0) film so as to embed the concave-convex structure by a selective lateral epitaxial growth method, whereby the $Al_xGa_yIn_zN$ film has low dislocation density areas on at least one of the concave portions and the convex portions.

According to the producing method of the present invention, since the base material having the concave-convex structure, for example composed of plural strip-shaped ditches is set into a CVD chamber, and then, the $Al_xGa_yIn_zN$ film is laterally and epitaxially grown, the above epitaxial growth substrate can be provided efficiently.

Moreover, since the $Al_xGa_yIn_zN$ film to constitute the epitaxial growth substrate is not influenced by a mask-forming process as in the above conventional method, an epitaxial growth substrate having good properties can be provided.

BRIEF DESCRIPTION OF THE DRAWINGS

For better understanding of the present invention, reference is made to the attached drawings, wherein.

DESCRIPTION OF THE PREFERRED EMBODIMENTS

Figure 3A:
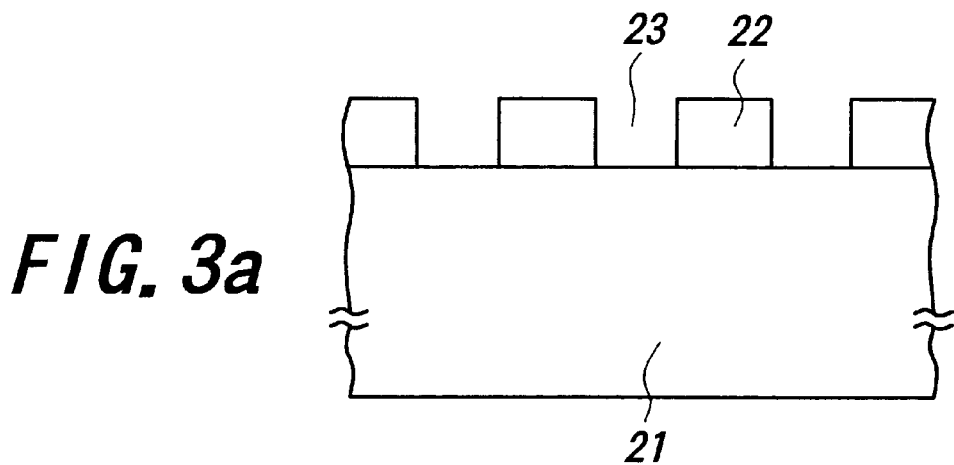
FIG. 3a–3c are cross sectional views showing successive steps in producing an epitaxial growth substrate according to the present invention.
Figure 3B:
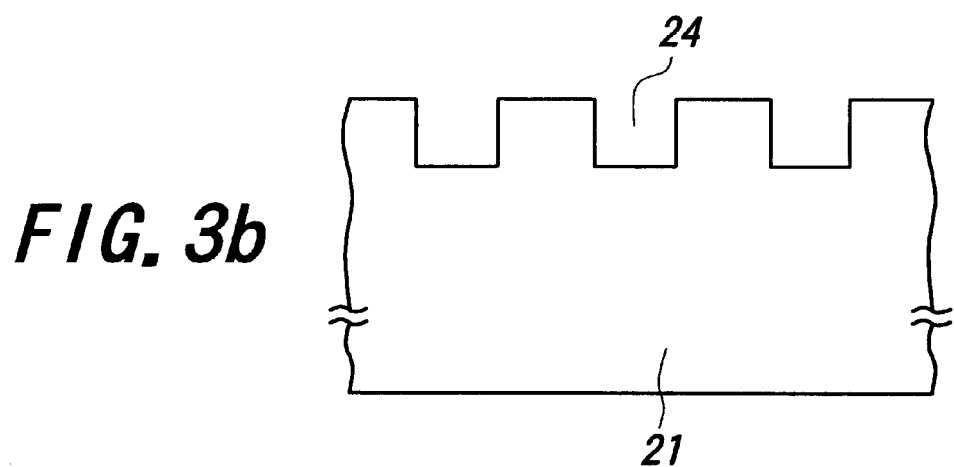
Figure 3C:
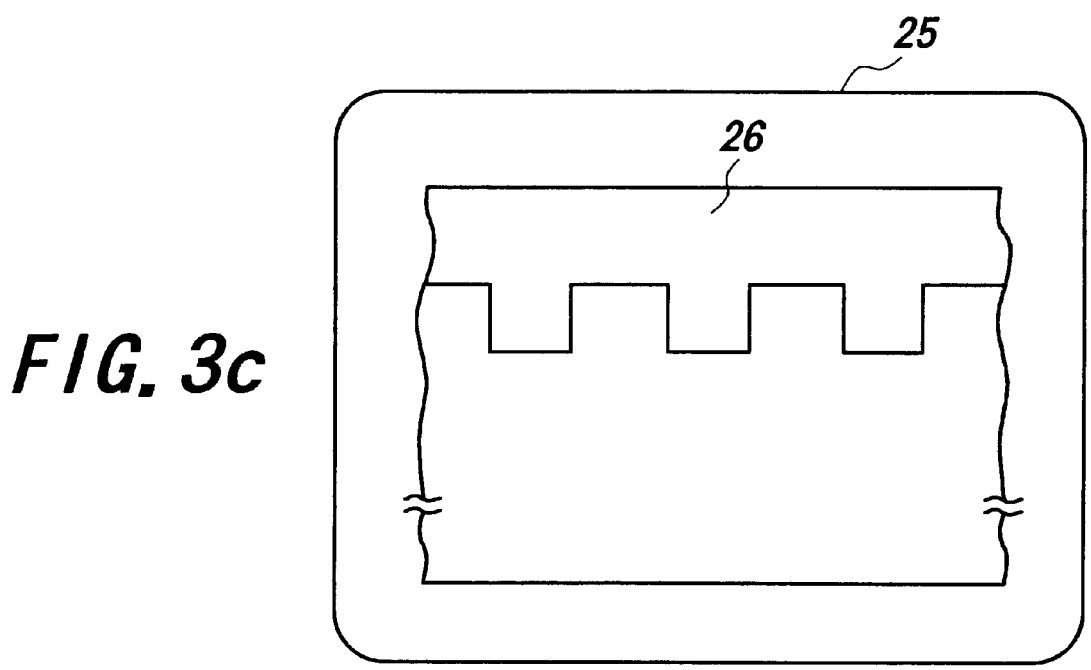

FIG. 3a–3c are cross sectional views showing successive steps in producing an epitaxial growth substrate according to the present invention. First of all, as shown in FIG. 3a, a photoresist 22 is formed on a sapphire substrate 21 as a base material, and openings 23 are formed at the photoresist 22 by photolithography. The width of each opening is about 1 μm and the distance between the adjacent openings is about 1 μm.

Next, as shown in FIG. 3b, the sapphire substrate 21 is selectively etched via the remaining photoresist 22 as a mask to form plural ditches 24 in a strip shape, and then, the remaining photoresist 22 is removed. Dry etching process such as ion beam etching or reactive ion etching may be preferably employed as the etching process for the sapphire substrate, but wet etching process may be done.

The width of the ditch 24 is determined on the width of the opening 23. The depth of the ditch 24 is determined on the etching time, and may be set to about 0.1 μm.

Figure 4:
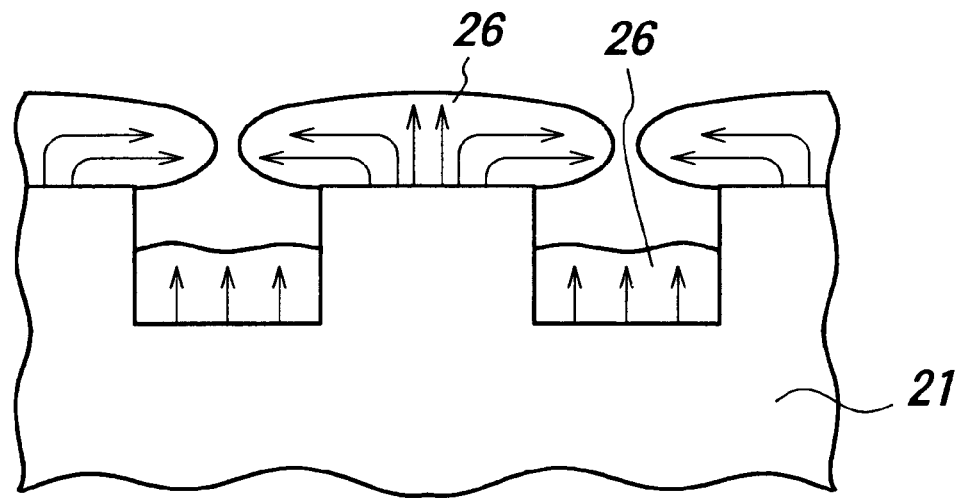
FIG. 4 is a cross sectional view showing the dislocation movement state in process of epitaxially growing an $Al_xGa_yIn_zN$ (x+y+z=1,x>0,y,z≧0) film to constitute an epitaxial growth substrate according to the present invention.

Then, as shown in FIG. 3c, the sapphire substrate 21 having the concave-convex structure composed of the plural strip-shaped ditches thereon is set into a CVD chamber 25, and an $Al_xGa_yIn_zN$ (x+y+z=1,x>0,y,z≧0) film 26 is epitaxially grown on the sapphire substrate. In this case, as shown in FIG. 4, the $Al_xGa_yIn_zN$ film 26 is laterally grown only on the convex portions of the concave-convex structure, not in the concave portions thereof because of the disturbance of the side walls of the plural strip-shaped ditches.

Therefore, the dislocations at the interface between the sapphire substrate 21 and the an $Al_xGa_yIn_zN$ film 26 are transmitted longitudinally, not laterally.

Figure 5:
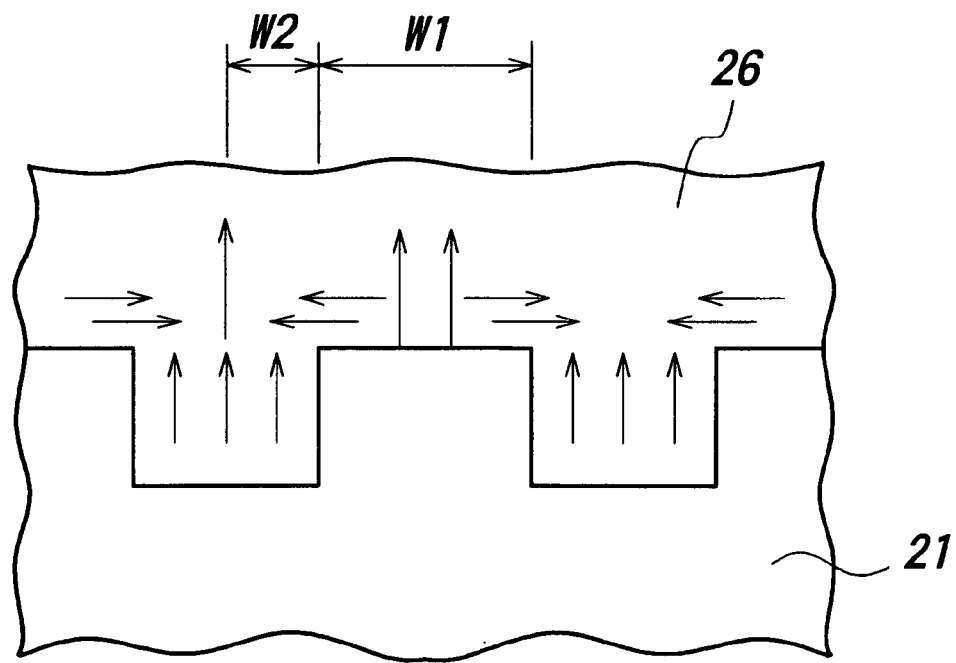
FIG. 5 is a cross sectional view showing the dislocation distribution state in an epitaxial growth substrate according to the present invention.

Therefore, at the time when the flat $Al_xGa_yIn_zN$ film 26 is formed through the coalescence of the longitudinally and epitaxially grown $Al_xGa_yIn_zN$ film on the sapphire substrate and the laterally and epitaxially grown on the concave-convex structure, as shown in FIG. 5, the dislocations bends to the upper sides of the ditches constituting the concave-convex structure, so that there are small amount of dislocation at the areas W1 and W2 of the $Al_xGa_yIn_zN$ film 26. If the dislocation density at the interface between the sapphire substrate and the $Al_xGa_yIn_zN$ film 26 is about $10^{10}/cm^2$, in particular, the dislocation density at the areas W2 is about only $10^6/cm^2$.

Figure 1:
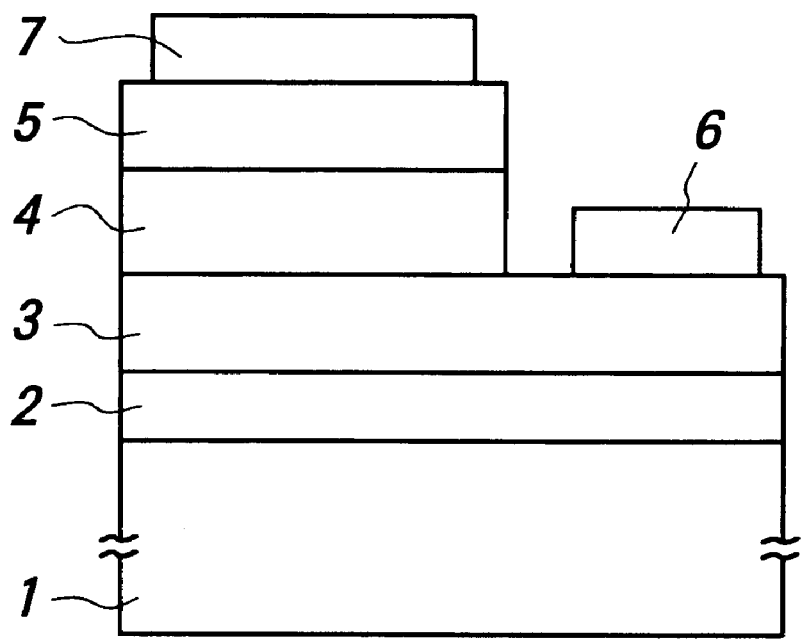
FIG. 1 is a cross sectional view showing the construction of a conventional light emitting diode.
Figure 2A:
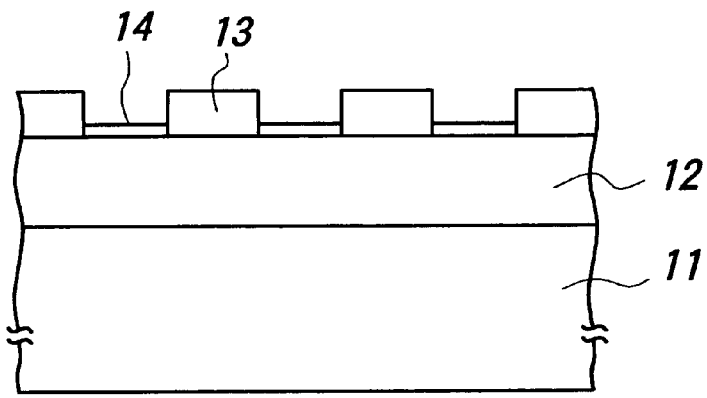
FIGS. 2a-2c are cross sectional views showing successive steps in a conventional selective lateral epitaxial growth method.
Figure 2B:
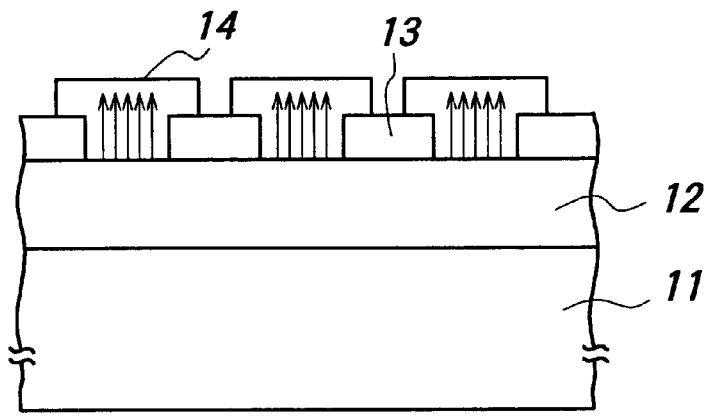
Figure 2C:
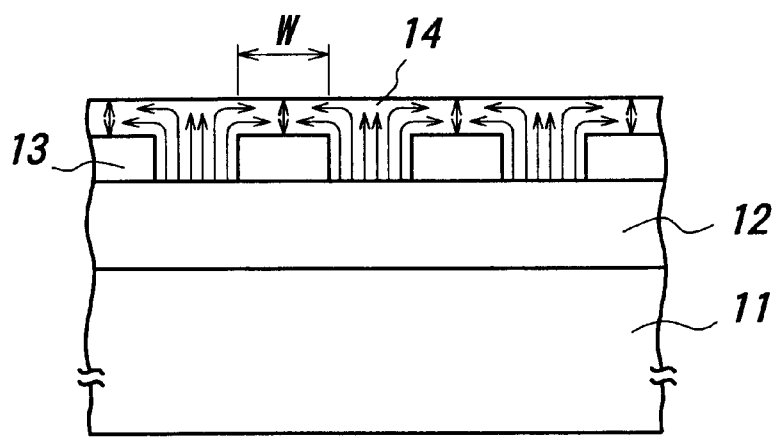

Then, plural $Al_aGa_bIn_cN$ (a+b+c=1,a>0,b,c≧0) films are epitaxially grown on the thus obtained epitaxial growth substrate having the above $Al_xGa_yIn_zN$ film 26 thereon to form such a light emitting element as in FIG. 1, for example. In this case, since the epitaxial growth substrate has a small amount of dislocation entirely, the plural $Al_aGa_bIn_cN$ films also have small amounts of dislocation, so that the light emitting element does not have undesired light absorption centers and can have high light emission efficiency.

Moreover, the above dislocation density-reducing effect becomes conspicuous as the Al content in the $Al_xGa_yIn_zN$ film constituting the epitaxial growth substrate according to the present invention is increased, particularly in the $Al_xGa_yIn_zN$ film with 50 atomic percents or over of Al, more particularly in the AlN film.

In addition, the ditches of the epitaxial growth substrate shown in FIG. 4 can be employed for scribe lines in cutting the substrate into plural pieces. Therefore, the thrive line-forming process can be emitted, resulting in the simplicity of the cutting process. Example:

Reactive Ion Etching was implemented on a C-faced sapphire substrate as a base material to form plural strip-shaped ditches having a width of about 1 μm and a depth of 0.2 μm. Subsequently, the sapphire substrate was heated to 1200° C, and trimethyl aluminum (TMA) and ammonium ($NH_3$) were introduced onto the sapphire substrate on condition that the pressure was 15 Torr and the flow rate ratio ($NH_3$/TMA) was 450 to form an AlN film in a thickness of 2 μm. Herein, the film-forming rate was about 1 μm.

The dislocation density of the AlN film was about $10^6/cm^2$ in the whole range, so that it was turned out that the epitaxial growth substrate with the AlN film had a remarkably reduced dislocation density in comparison with a conventional one. Therefore, the thus obtained epitaxial growth substrate can be used for a light emitting element or the like.

Although the present invention was described in detail with reference to the above examples, this invention is not limited to the above disclosure and every kind of variation and modification may be made without departing from the scope of the present invention.

For example, the above epitaxial growth substrate may be composed of a SiC substrate or a GaN substrate as a base material instead of the sapphire substrate.

Moreover, using the epitaxial growth substrate, another electronicdevice such as a light emitting diode to emit another color light or ultraviolet light, a laser diode and a field effect transistor can be produced.

As mentioned above, the epitaxial growth substrate of the present invention has the $Al_xGa_yIn_zN$ ($x+y+z=1, x>0, y,z\geqq 0$) film with low dislocation density. Therefore, when additional $Al_aGa_bIn_cN$ ($a+b+c=1, a>0, b,c\geqq 0$) films are formed on the epitaxial growth substrate in turn by epitaxial growth in order to produce an electronic device such as a light emitting diode, a laser diode or a field effect transistor, the performances of the electronic device can be improved. Particularly, the above improvement effect becomes conspicuous in the light emitting diode and the laser diode because the dislocation density influence their performances.

Moreover, the epitaxial growth substrate-producing method of the present invention does not require the steps of taking a base material out of a CVD chamber in order to etch the base material and setting into a CVD chamber again in order to form the $Al_xGa_yIn_zN$ ($x+y+z=1, x>0, y,z\geqq 0$) film, different from the above conventional method. Therefore, the epitaxial growth substrate can be produced efficiently.

What is claimed is:

1. An epitaxial growth substrate comprising a base material having a strip-shaped concave-convex structure thereon and an epitaxially grown $Al_xGa_yIn_zN$ ($x+y+z=1, x>0, y,z\geqq 0$) film formed so as to embed the concave-convex structure by a selective lateral epitaxial growth method and having low dislocation density areas on at least one of the concave portions and the convex portions of the concave-convex structure.

2. An epitaxial growth substrate as defined in claim 1, wherein the Al content in the $Al_xGa_yIn_zN$ film is 50 atomic percents or over.

3. An epitaxial growth substrate as defined in claim 2, wherein the $Al_xGa_yIn_zN$ film has a composition of AlN.

4. An epitaxial growth substrate as defined in claim 1, wherein the strip-shaped concave-convex structure is composed of plural kinds of strip-shaped ditches formed on the base material.

5. A method for producing an epitaxial growth substrate comprising the steps of:
   preparing a base material,
   forming a strip-shaped concave-convex structure on a surface of the base material, and
   epitaxially growing an $Al_xGa_yIn_zN$ ($x+y+z=1, x>0, y,z\geqq 0$) film so as to embed the concave-convex structure by a selective lateral epitaxial growth method, whereby the $Al_xGa_yIn_zN$ film has low dislocation density areas on at least one of the concave portions and the convex portions.

6. A method for producing an epitaxial growth substrate as defined in claim 5, wherein the Al content in the $Al_xGa_yIn_zN$ film is 50 atomic percents or over.

7. A method for producing an epitaxial growth substrate as defined in claim 6, wherein the $Al_xGa_yIn_zN$ film has a composition of AlN.

8. A method for producing an epitaxial growth substrate as defined in claim 5, wherein the strip-shaped concave-convex structure is composed of plural kinds of strip-shaped ditches formed on the base material.

9. A method for producing an epitaxial growth substrate as defined in claim 8, further comprising the step of the base material having the $Al_xGa_yIn_zN$ film is cut into plural pieces at the ditches of the concave-convex structure as scribe lines.

* * * * *